United States Patent [19]

Moore

[11] Patent Number: 4,720,746
[45] Date of Patent: Jan. 19, 1988

[54] FRAME TRANSFER CCD AREA IMAGE SENSOR WITH IMPROVED HORIZONTAL RESOLUTION

[75] Inventor: Leslie G. Moore, Webster, N.Y.

[73] Assignee: Eastman Kodak Company, Rochester, N.Y.

[21] Appl. No.: 762,172

[22] Filed: Aug. 5, 1985

[51] Int. Cl.$^4$ .............................................. H04N 3/14
[52] U.S. Cl. ......................... 358/213.28; 358/213.25
[58] Field of Search ................... 358/213, 212, 44, 48; 357/24 LR

[56] References Cited

U.S. PATENT DOCUMENTS

| | | | |
|---|---|---|---|
| 3,911,467 | 10/1985 | Levine et al. | 358/213 |
| 4,042,956 | 8/1977 | Yamanaka | 358/41 |
| 4,064,532 | 12/1977 | Yamanaka | 358/44 |
| 4,155,094 | 5/1979 | Ohba et al. | 357/30 |
| 4,179,706 | 12/1979 | Nishimura et al. | 358/44 |
| 4,200,892 | 4/1980 | Weimer | 358/213 |
| 4,242,700 | 12/1980 | Weimer | 358/44 |
| 4,291,239 | 9/1981 | Weimer | 307/221 D |
| 4,380,056 | 4/1983 | Parrish et al. | 357/24 LR |
| 4,580,169 | 4/1986 | Savoye | 358/213 |

OTHER PUBLICATIONS

Sei et al., "A Meander Channel CCD Linear Image Sensor", *IEEE Journal of Solid-State Circuits*, vol. SC-130, No. 1, Feb. 1978.

Ochi et al., "A Device Structure and Spatial Spectrum for Checker-Pattern CCD Color Camera", *IEEE Transactions on Electron Devices*, vol. ED-25, No. 2, Feb. 1978.

*Primary Examiner*—Gene Z. Rubinson
*Assistant Examiner*—Stephen Brinich
*Attorney, Agent, or Firm*—Raymond L. Owens

[57] ABSTRACT

A frame transfer CCD area image sensor is disclosed having a plurality of spaced transfer channels having resolution cells defined by electrodes. Each resolution cell samples an image scene pixel. Channel stops separate the channels and are arranged to stagger adjacent resolution cells in the channels to improve horizontal resolution.

4 Claims, 7 Drawing Figures

FRAME TRANSFER CCD AREA IMAGE SENSOR WITH IMPROVED HORIZONTAL RESOLUTION

FIELD OF THE INVENTION

This invention relates to frame transfer CCD area image sensors with improved resolution.

BACKGROUND OF THE PRIOR ART

One well known organization of CCD area image sensors is the frame or field transfer organization. In this arrangement, charge transfer channels run in vertical directions. Separating each transfer channel is a channel stop which confines charge collected to the transfer channels and prevents charge leakage into adjacent channels. Channel stops are provided by thick field oxides and also by diffusion or implants in the substrate. Each transfer channel has a plurality of resolution cells. Each resolution cell is defined by a plurality of closely spaced, independent electrodes. An independent electrode is one which is separately addressable. So for example a three-phase CCD has three independent electrodes per cell, and a four-phase CCD has four independent electrodes per cell. Each electrode is formed on an insulator which overlays a substrate. The electrodes can be made from transparent polysilicon or metal conductors. As is well known in applications where an image is sampled and displayed on a T.V., there are two fields for each frame. During the first field a potential is applied to at least one electrode of each resolution cell and a depletion region or well is formed under it. Photocharge collected in the well is a function of scene brightness level. The photocharge is then read out and converted to voltage signals which are used to produce an image. During the next field, a depletion region is formed under another electrode of each resolution cell thereby vertically shifting the integration site for each resolution cell for the second field. This "virtual" interlacing effectively increases vertical resolution without substantially modifying the vertical modulation transfer function (MTF). This approach is widely used but suffers from the shortcoming that horizontal resolution is not improved. One way to improve horizontal resolution is to increase the number of resolution cells per unit length in the horizontal dimension. This approach increases complexity and reduces the yield of area image sensors thereby increasing their cost. Also, between fields of a frame, the area image sensor can be moved horizontally relative to an object scene to increase horizontal resolution.

SUMMARY OF THE INVENTION

The object of this invention is to provide a frame transfer CCD area image sensor in which horizontal resolution is improved without increasing the number of sensor resolution cells or having to move the sensor relative to an image.

This object is achieved by a frame transfer CCD area image sensor which includes a plurality of spaced transfer channels having resolution cells. Each resolution cell samples a scene image and accumulates charge representing the brightness level of an image pixel. The channel resolution cells are arranged to define an array of rows and columns of resolution cells. The sensor further includes channel stops which separate the transfer channels and are arranged to stagger adjacent resolution cells of each channel to improve resolution.

In one preferred embodiment, each resolution cell includes a plurality of electrodes. A potential energy well can be formed under a first electrode of a resolution cell during a first field of a frame and formed under a second electrode of such resolution cell during a second field of the frame. Horizontal staggering of the center of charge of adjacent cells within each field occurs from row-to-row and the vertical shift of the center of charge (virtual interlace) by each cell occurs from field-to-field within each frame.

An advantage of this invention is that it reduces both vertical and horizontal aliasing effects.

Another advantage of this invention is that it is suitable for single CCD sensors using color filter arrays. An integral color filter can, for example, be disposed over each channel.

DESCRIPTION OF THE DRAWINGS

FIG. 6 are potential profiles taken along the centerline of staggered channels showing the different integrating fields for interlacing.

DESCRIPTION OF THE PREFERRED EMBODIMENT

Figure 1:
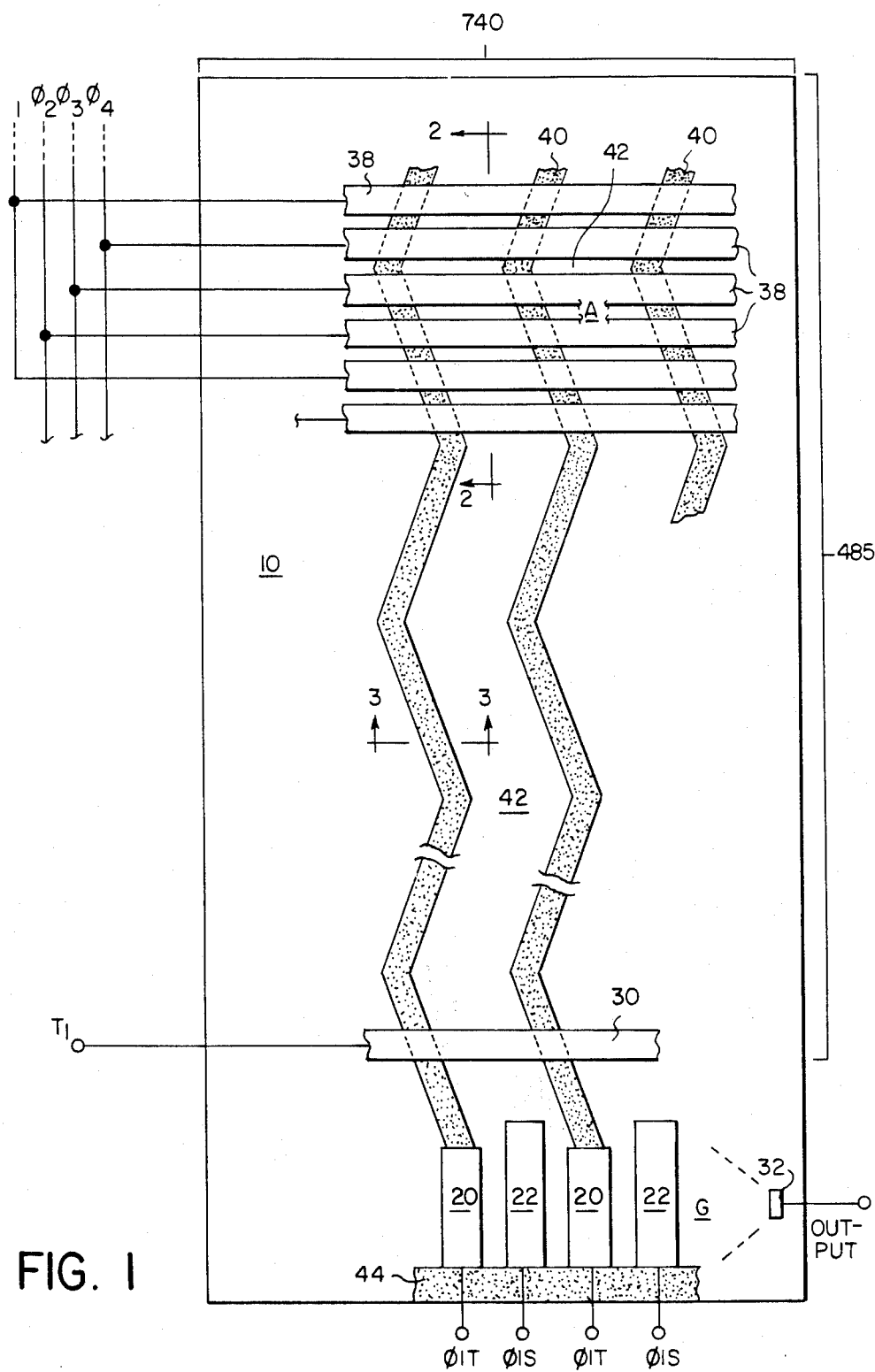
FIG. 1 is a schematic overall view of a frame transfer CCD area image sensor in accordance with the present invention showing in an exploded format resolution cells of several staggered transfer channels.

The overall configuration of a CCD area image sensor 10 which embodies the present invention is shown in FIG. 1. For clarity of illustration, this view is not to scale. The image sensor 10 comprises a frame transfer four-phase (voltage lines $\phi_1$–$\phi_4$) and a surface channel CCD area image sensor. The image is sensed by resolution cells in transfer channel 42. As will be described, each resolution cell is defined by a plurality of transparent, independent electrodes 38. By way of illustration only, the resolution cells are arranged in a staggered two-dimensional array (A) having 740 staggered columns and 485 rows of resolution cells. Each transparent electrode is connected to one line or phase of a four-phase clock signal. After exposure the four clock signals are sequentially applied in the well known manner to the image sensing array A to move the imagewise charge pattern formed in the sensor resolution cells one row at a time to an output register C. Between adjacent transfer channels there are provided channel stops 40. These channel stops 40 are staggered so as to improve horizontal resolution in a manner which will be described later.

A 14 MHz clock drives the clock signals for reading out the rows of the image sensor at the standard television line rate. The output register G is a conventional two-phase CCD shift register positioned between a transfer gate 30 and a horizontal channel stop 44. Each cell of the output register G includes a transfer electrode 20 aligned with a vertical channel stop 40 and a storage electrode 22 which is aligned with a transfer channel 42. These electrodes are actuated by signals on lines $\phi_{1T}$ and $\phi_{1S}$ respectively.

The operation of the gate 30 and the output register G is well known in the art and so will only be briefly described. The transfer gate 30 which is actuated by a first transfer signal $T_1$ and transfers a row of photocharges to the output register G. As noted above, each cell in the output register G has a storage electrode 22 associated with a transfer column of the array A. When a row of photocharges is to read out of image sensing array A, the transfer gate 30 is opened and photocharges are delivered to storage wells which have been formed under the electrodes 22.

After a row of photocharge (electrons) has been transferred to the output register G, the transfer gate 30 is closed. By being closed is meant that a potential barrier is formed under this transfer electrode. At this time the output register is operated in a two-phase manner clocking the photocharges out through an output diode 32 which converts the photocharges into a voltage in the well-known manner.

Figure 2:
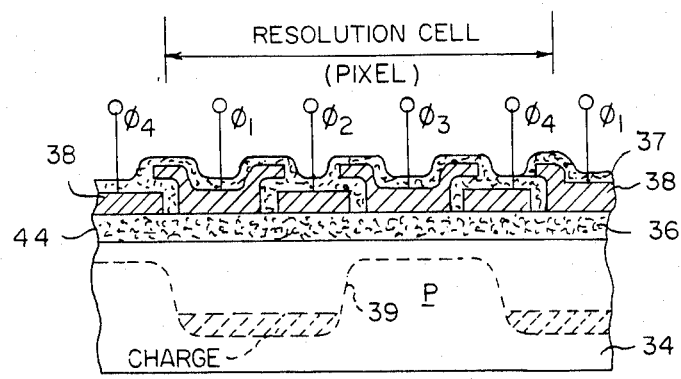
FIG. 2 is a cross-sectional view taken along the lines 2—2 of FIG. 1 showing a resolution cell in a transfer channel of the sensor.

Turning now to FIG. 2, the CCD sensor is shown to be constructed on a doped semiconductor substrate 34 (e.g. p-type silicon). A silicon dioxide, $SiO_2$, layer 36 is grown on the substrate 34. Silicon dioxide has the fundamental property of preventing the diffusion of impurities through it. Polysilicon conductive electrodes 38 are then deposited on the silicon dioxide layer 36. The conductive electrodes could also be made of a metal such as aluminum. The silicon dioxide layer 36 and the electrodes 38 are transparent and permit photons of light to pass through them into the bulk of substrate 34. A thin protective layer 37 of silicon dioxide overcoats the electrodes 38.

Figure 3:
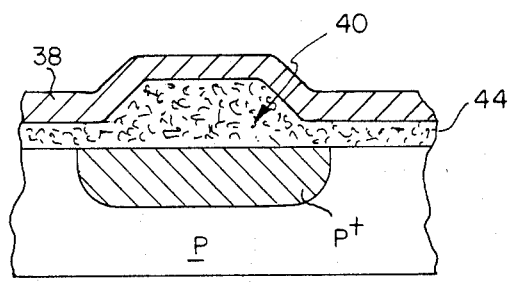
FIG. 3 is a cross-sectional view taken along the lines 3—3 of FIG. 1 showing a channel stop between adjacent transfer channels.

Channel stops 40, shown in FIG. 3, are defined by a more heavily doped (e.g. p+) region covered by a thickened oxide layer 44. The transfer channels 42 are as noted above separated by the channel stops 40 and overlayed with the four-phase transfer electrodes 38. The thickened field oxide and doped region in the channel stop area is selected such that the bulk p-type silicon directly below it never becomes depleted notwithstanding the voltage applied to its electrode 38.

When a potential is applied to an electrode 38, a depletion region is formed under that electrode. As shown in FIG. 2, a resolution cell or pixel includes four electrodes. If, for example, the same positive potential is applied by voltage lines $\phi_1$ and $\phi_2$ and no potential is applied to voltage lines $\phi_3$ and $\phi_4$, a depletion region is formed in the substrate 34 under those electrodes having applied potential. When the positive potential is applied, it repels holes into the substrate. Lattice electrons are exposed and the depletion region is thereby formed. The potential profile of the depletion region is referred to as an energy or potential well and is shown in FIG. 2 as a dotted line 39.

Since the electrodes are transparent, during exposure, scene light passes through them and photons of light are absorbed in the substrate. Free electrons are produced by a photoelectric conversion process and are collected in the potential well as schematically shown in FIG. 2. These electrons (photocharge) are free to move about but can not penetrate the walls of the potential well. The potential profile on the different electrodes can now be changed by varying the voltages on lines $\phi_1$–$\phi_4$ so as to shift the charge down into the horizontal read-out register G. As shown in FIG. 1, the photocharge shifted into the register G is now shifted to the diode 32 which converts the photocharge into a voltage. The charge transfer channels 40 and the shift register G are standard charge transfer arrangements wherein by properly applying periodic voltages to their electrodes a moving array of potential wells can be formed in which charge is shifted from one position to another. The operation of these types of charge transfer devices is well known in the art and described fully in the text book CHARGE TRANSFER DEVICES by Sequin et al. Pages 23–25 describe the operation of a conventional four-phase CCD electrode structure and pp. 25–30 describe the operation of conventional two-phase CCD electrode structures.

As shown in FIG. 1, the channel stops define a staggered or alternating pattern of resolution cells in each column in the form of a zig-zag. The term stagger is in reference to the situation where the center of charge collection of adjacent resolution cells in a channel are offset. The horizontal structure of a resolution cell is defined between channel stops while the electrodes define the vertical structure. Virtual interlacing is implemented in the conventional manner by changing the center of charge of each resolution cell.

Figure 4A:
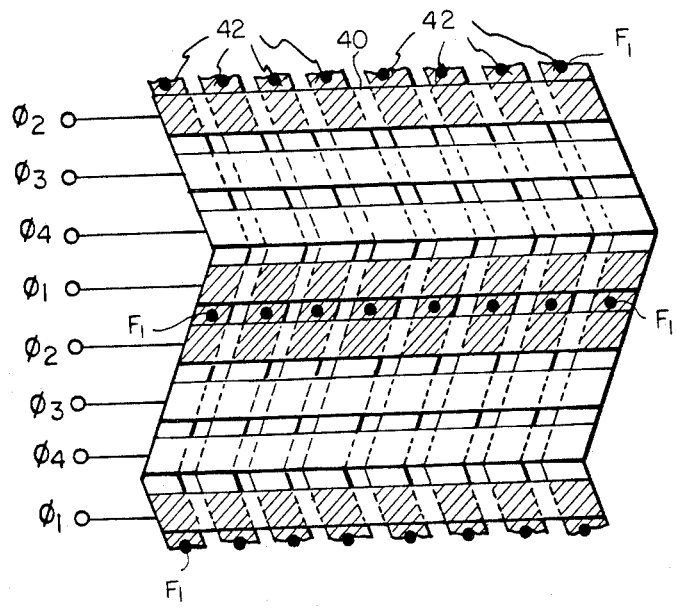
FIGS. 4a and 4b are schematic diagrams showing the collection of charge in different potential wells by the resolution cells of the FIG. 1 sensor in first and second fields of operation, respectively.
Figure 4B:
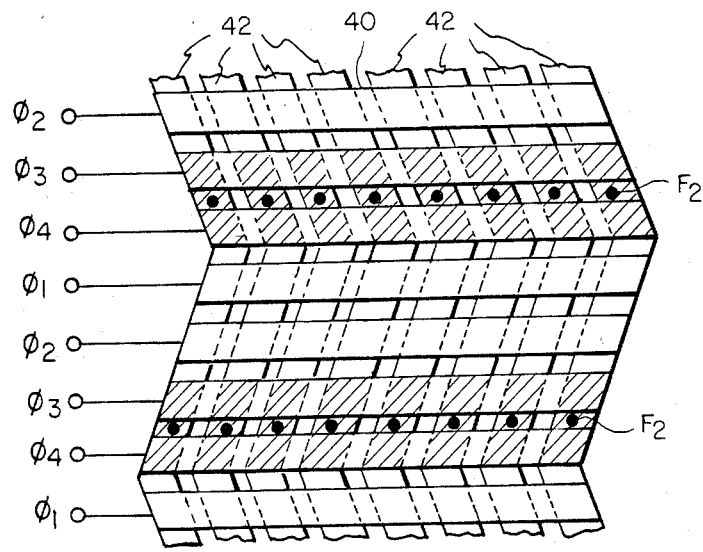

Reference may now be made to FIGS. 4a and 4b which illustrate the operation of a two field per frame device in its first and second fields, respectively. As shown in FIG. 4a, a positive potential is applied to the lines $\phi_1$ and $\phi_2$, and a potential well for each resolution cell is formed under these electrodes and charge collects in them. The center of charge for each resolution cell is shown at position $F_1$. In the second field of operation shown in FIG. 4b, a positive potential is applied to the lines $\phi_3$ and $\phi_4$ and charge is collected under these electrodes. In this case, the center of charge is shown as $F_2$. Thus, during the first field, charge will be collected in the potential well under all the electrodes connected to lines $\phi_1$ and $\phi_2$ and during the second field, charge will be collected under all the electrodes connected to lines $\phi_3$ and $\phi_4$. In each field, the center of charges of adjacent resolution cells in each channel 42 are offset or staggered horizontally. When the center of charges of each resolution cell are connected, the result is a nonlinear pattern. In each row of resolution cells, if the center of charges are connected, the result is a linear pattern.

Due to virtual interlace, in the first field each resolution cell samples a different image pixel than it samples in the second field. Image pixels sampled by adjacent resolution cells in a channel are offset horizontally from row-to-row within a field and vertically from field-to-field within a frame. Moreover, where there are two fields per frame, the center of collected charge of each resolution cell from field-to-field is shifted not only vertically but also horizontally. Thus, there is an improvement in both vertical and horizontal resolution. See FIG. 6 which shows representative potential profiles during interlacing.

Although the image sensor 10 has been described as a surface channel sensor, it will be understood that the invention is also applicable to a buried channel sensor. In a buried channel CCD sensor, the electrodes are disposed on an insulator such as $SiO_2$. The insulator overlies the substrate. The bulk substrate is doped and can be of a given polarity for example p-type. Near the insulator the substrate is of a polarity (n-type) opposite to that of the bulk substrate and of such a concentration that when a predetermined potential is applied to the electrode, a channel or potential well is formed within the substrate spaced from the insulator. Charge is collected in this channel or well which is a function of scene brightness. More specifically, carriers are produced by a photoelectric conversion process and collected in the channel.

Figure 5:
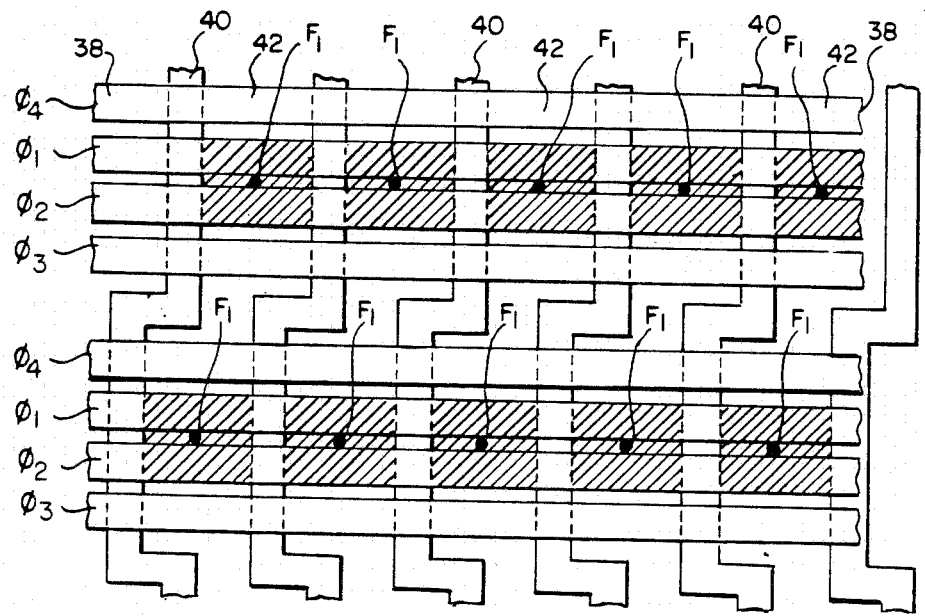
FIG. 5 is a schematic diagram showing the collection of charge for a frame transfer CCD image sensor having a different staggered sensor resolution cell pattern than in FIG. 1.

Turning now to FIG. 5, where charge collection for another frame transfer CCD area image sensor is shown. The image area CCD represented has a different staggered channel stop structure. This image area sensor has an array of rows and staggered columns of rectangular shaped resolution cells. This arrangement is particularly suitable for pattern recognition devices which have a single field per frame. Each resolution cell in each channel 42 is defined horizontally between channel stops 40 and vertically by four electrodes 38. Each electrode 38 is connected to a particular one or four voltage phase lines $\phi$. If a positive potential is applied to line $\phi_1$ and $\phi_2$, a potential well for each resolution cell is formed under these electrodes and charge collects in them. In such a situation, the center of charge is shown as $F_1$. For adjacent resolution cells in a channel 42, the position of the center of charges are offset or staggered horizontally. The construction of adjacent channel stops 40 stagger adjacent resolution cells. Each resolution cell has a rectangular configuration. If a line were to connect the center of charge in each column, it would be non-linear. If a line were to connect the center of charge in each row, it would be linear.

I claim:

1. A frame transfer CCD area image sensor comprising:
   (a) a plurality of spaced transfer channels having resolution cells each of which samples light from an image scene and accumulates photocharge representing the brightness level of an imgae pixel, such resolution cells being arranged to define an array of rows and columns of resolution cells;
   (b) channel stops which separate the transfer channels and are arranged to stagger adjacent resolution cells in a channel; and
   (c) output register means for sequentially receiving photocharges from each row of resolution cells during a readout operation.

2. A frame transfer CCD area image sensor for sensing different fields of an image, comprising:
   a. a plurality of spaced transfer channels having a plurality of resolution cells arranged so as to define an array of rows and columns of resolution cells each of which accumulates charge representing the brightness level of light from a sampled image scene pixel, each channel resolution cell includes a substrate, a transparent nonconductive layer covering the substrate and a predetermined number of closely spaced, independent transparent electrodes to which potential can be applied;
   b. channel stops which separate the transfer channels and are arranged to stagger adjacent resolution cells in a channel; and
   c. means for applying potential to selected different ones of the electrodes of each resolution cell during first and second fields of a frame so that a potential energy well is formed under a first electrode of each resolution cell to collect charge representing the brightness level of a scene image pixel during the first field and a potential barrier is formed under a second electrode of each resolution cell and during the second field a potential well is formed under the second electrode to collect charge representing the brightness level of another image scene pixel and a potential barrier is formed under the first electrode, whereby horizontal staggering of the center of charge of adjacent resolution cells in a channel occurs from row-to-row within each field and the vertical shifting of the center of charge sense by each resolution cell occurs from field-to-field with each frame.

3. A frame transfer CCD area image sensor comprising:
   (a) a plurality of spaced transfer channels having resolution cells each of which samples a scene image and accumulates photocharge representing the brightness level of an image pixel, such resolution cells being arranged to define an array of rows and columns of resolution cells; and
   (b) channel stops which separate the transfer channels and are arranged to stagger adjacent resolution cells in a channel so that when the center charge collected under adjacent resolution cells in each channel are connected, the result is a non-linear pattern and when the center of charges of the resolution cells of each row of the array are connected, the result is a linear pattern.

4. A frame transfer CCD area image sensor for sensing different fields of an image, comprising:
   a. a plurality of spaced transfer channels having a plurality of resolution cells arranged so as to define an array of resolution cells each of which accumulates photocharge representing the brightness level of a sampled image scene pixel, each channel resolution cell includes a substrate, a transparent nonconductive layer covering the substrate and a plurality of closely spaced, independent transparent electrodes to which potential can be applied;
   b. channel stops which separate the transfer channels and are arranged to stagger adjacent resolution cells in a channel;
   c. means for applying potential to selected different ones of the electrodes of each resolution cell during first and second fields of a frame so that a potential energy well is formed under a first electrode of each resolution cell to collect charge representing the brightness level of a scene image pixel during the first field and a potential barrier is formed under a second electrode of each resolution cell and during the second field a potential well is formed under the second electrode to collect charge representing the brightness level of another image scene pixel and a potential barrier is formed under the first electrode whereby horizontal staggering of the center of charge of adjacent resolution cells in a channel occurs from row-to-row within each field and the vertical shifting of the center of charge sensed by each resolution cell occurs from field-to-field within each frame; and
   d. output register means for sequentially receiving charge from each row of resolution cells during a readout operation.

* * * * *